US011915181B2

(12) United States Patent
Pang et al.

(10) Patent No.: US 11,915,181 B2
(45) Date of Patent: Feb. 27, 2024

(54) UPPER CONFIDENCE BOUND ALGORITHM FOR OILFIELD LOGIC

(71) Applicant: Schlumberger Technology Corporation, Sugar Land, TX (US)

(72) Inventors: John Pang, Melo Park, CA (US); Vishakh Hegde, Melo Park, CA (US); Joseph Chalupsky, Melo Park, CA (US)

(73) Assignee: Schlumberger Technology Corporation, Sugar Land, TX (US)

(*) Notice: Subject to any disclaimer, the term of this patent is extended or adjusted under 35 U.S.C. 154(b) by 903 days.

(21) Appl. No.: 16/684,495

(22) Filed: Nov. 14, 2019

(65) Prior Publication Data

US 2021/0150440 A1 May 20, 2021

(51) Int. Cl.
*G06Q 10/0637* (2023.01)
*G06N 5/02* (2023.01)
*G06Q 10/0631* (2023.01)
*G06F 30/20* (2020.01)

(52) U.S. Cl.
CPC ....... *G06Q 10/06375* (2013.01); *G06F 30/20* (2020.01); *G06N 5/02* (2013.01); *G06Q 10/06313* (2013.01)

(58) Field of Classification Search
CPC ........ G06Q 10/06375; G06Q 10/06313; G06F 30/20; G06N 5/02
USPC .......................................................... 703/10
See application file for complete search history.

(56) References Cited

U.S. PATENT DOCUMENTS

2021/0131260 A1* 5/2021 Zagayevskiy ........... G06F 30/28
2022/0236698 A1* 7/2022 Froehlich ............. G05B 13/027

OTHER PUBLICATIONS

Bangerth_2006 (On optimization algorithms for the reservoir oil well placement problem, Comput Geosci (2006)) (Year: 2006).*
Auer_2002 (Using Confidence Bounds for Exploitation-Exploration Trade-offs, Journal of Machine Learning Research 3 (2002)) (Year: 2002).*
Guyaguler_2002 (Optimization of Well Placement and Assessment of Uncertainty, Stanfor University Jun. 2002 (Year: 2002).*
Kim_2016 (Using Bayesian Optimization for Reinforcement Learning, Reinforcement Learning, Training & Tuning 2016) (Year: 2016).*

(Continued)

*Primary Examiner* — Brian S Cook
(74) *Attorney, Agent, or Firm* — Jeffrey D. Frantz

(57) ABSTRACT

Various computer-implemented methods for utilizing a modified upper confidence bound (UCB) in an agent-simulator environment in well placement planning for oil fields are disclosed herein. A set of well placement sequences for placing well in a geographical region may be received, where each well placement sequent defines a sequence of multiple oil wells to be placed within the geographical region. A computer-implemented simulation may be executed on each of the well placement sequences to determine, for each of the well placement sequences, a reward based upon a calculated hydrocarbon recovery and a cost of the calculated hydrocarbon recovery. The well placement sequences may be iteratively selected for the computer-implemented simulations using the modified UCB algorithm and based upon the rewards determined for each of the plurality of well placement sequences.

16 Claims, 6 Drawing Sheets

(56) References Cited

OTHER PUBLICATIONS

Bangerth, et al., "On optimization algorithms for the reservoir oil well placement problem," Computational Geosciences, 10, pp. 389-404 (2006).
Davidson, et. al., "Integrated optimization for rate allocation in reservoir simulation," SPE Reservoir Simulation Symposium, 79701, Houston, TX, USA (2003).
Litvak, et. al., "Prudhoe Bay E-Field Production Optimization system Based on Integrated Reservoir and Facility Simulation," SPE Annual Technical Conference and Exhibition, 77643, San Antonio, USA (2002).
Torrado, et. al., "Optimal Sequential Drilling for Hydrocarbon Field Development Planning," Proceedings of 29th Association for the Advancement of Artificial Intelligence, Conferences on Innovative Applications (IAAI-17) (2017).
Wang, "Development and Applications of Production Optimization Techniques for Petroleum Fields", PHD Thesis, Palo Alto, CS, USA: Stanford University (2003).

\* cited by examiner

UPPER CONFIDENCE BOUND ALGORITHM FOR OILFIELD LOGIC

BACKGROUND

Well placement planning is a common activity in exploration, development, and production phases across the energy industry to plan out the placement of prospective wells. In the oil and gas industry, for example, well placement planning is used to select placements and trajectories for proposed wells into a subsurface reservoir to reach specific locations in the reservoir that are believed to contain recoverable hydrocarbons. Well placement planning may be used to produce a well placement plan that includes one or more wells, as well as additional information such as well trajectories, well completions, drilling schedules, etc. Generally, a reservoir simulator is used in connection with well placement planning so that a reservoir simulation may be performed to determine the potential value of any well placement plan.

Well placement planning may generally be considered to be an optimization problem. Generally, well placement planning has been performed in a predominantly manual process in which a user selects well locations, performs a simulation forecast, and then calculates a value based on the forecast oil and gas recovered and the cost of the wells. The user generally may repeat the process a number of times, but modify the number and location of the wells. Recent work has modeled well placement planning as a Partially Observable Markov Decision Problem (POMDP) that takes into account information acquired between each drilling location that is selected.

Well placement planning, however, has been found to be a very time-consuming process from the user's perspective and very computationally intensive from the simulation perspective. For example, depending on the scale of the oil field and the scope of the problem, these complex simulations can take days, weeks, or even years. Moreover, well placement planning has been found to be a relatively inefficient process because it may be difficult for a user or simulation to objectively explore the complete solution space in an efficient manner.

A need therefore exists in the art for a more effective and computationally efficient approach to well placement planning.

SUMMARY

The herein-described embodiments address these and other problems associated with the art by implementing a modified Upper Confidence Bound (UCB) algorithm in an agent-simulator environment. The modified UCB algorithm implemented in the agent-simulator environment uses a concept of reward and cost that is tied to oil and gas recovery. As hydrocarbon fields vary not only in recovery mechanism across different environments (e.g., deepwater oil reservoirs, onshore tight gas, coalbed methane, etc.), but also in cost scheme (e.g., export availability, drilling schedule, operational expenditure, etc.), the agent-simulator environment can be adapted to account for a variety of considerations across different scenarios. A decision space (or an action space) is an n dimensional representation (e.g., two dimensional, three dimensional, or four dimensional) of a geographical region in the agent-simulator environment, where n is a positive integer, and corresponds to the placement of a well in the geographical region. By implementing the modified UCB algorithm, the agent-simulator environment is configured to balance both exploration of the action space for the set of well placement sequences based on the cost scheme, and exploitation of a particular well placement sequence based on a reward corresponding to calculated hydrocarbon recovery for the particular well placement sequence. In particular, this exploitation provides a higher level of confidence for a given well placement sequence that is chosen as a result of simulations in the agent-simulator environment.

The above description is provided as an overview of some embodiments of the present disclosure. Further description of those embodiments, and other embodiments, are described in more detail below.

Consistent with one aspect of the invention, a method implemented by one or more processors is provided, the method includes receiving a set of well placement sequences for placing wells in a geographical region, each well placement sequence in the set defining a sequence of multiple wells to be placed within the geographical region, executing a computer-implemented simulation on each of the well placement sequences in the set to determine, for each of the well placement sequences, a reward based upon a calculated hydrocarbon recovery for the well placement sequence and a cost of the calculated hydrocarbon recovery, and iteratively selecting well placement sequences in the set upon which to execute computer-implemented simulations from among the plurality of well placement sequences using an upper confidence bound algorithm and based upon the rewards determined for each of the plurality of well placement sequences.

In some embodiments, the method may further include obtaining an action space corresponding to the geographical region, the action space being an n dimensional representation of the geographical region, and the action space including one or more areas of interest indicative of predicted hydrocarbon saturation, where n is a positive integer. In some embodiments, the method may further include obtaining a plurality of actions, where a given action of the actions is to be performed, at a given time step of the computer-implemented simulation, in the action space for each of the well placement sequences in the set.

In some of those embodiments, the method may further include configuring a simulator to execute the computer-implemented simulation on each of the well placement sequences in the set based on the action space and the set of well placement sequences, and for each of the well placement sequences in the set: performing, by the configured simulator, each action in the action space to determine: the reward for each of the actions, at the given time step, based upon the calculated hydrocarbon recovery for the well placement sequence, and the cost of the calculated hydrocarbon recovery for each of the actions, at the given time step, for the well placement sequence. In some of those embodiments, the methods may further include generating, based on the reward and the cost for each of the actions, a reward distribution.

In some further embodiments, the method may further include, until convergence of the upper confidence bound algorithm: selecting, based on the reward distribution for each of the well placement sequences in the set, a given well placement sequence, performing, by the configured simulator and for the given well placement sequence, each action in the action space to determine: a new reward for each of the actions based upon the calculated hydrocarbon recovery for the given well placement sequence, and a new cost of the calculated hydrocarbon recovery for each of the actions for the given well placement sequence. In some further embodiments, the method may further include updating, based on the new reward and the new cost for the given well placement sequence, the reward distribution for the given well placement sequence to generate an updated reward distribution for the given well placement sequence.

In some of those further embodiments, convergence may be based on one or both of: a threshold number of computer-implemented simulations being executed, and a confidence threshold for a particular reward distribution corresponding to a particular well placement sequence being exceeded. In some of those yet further embodiments, updating the reward distribution for the given well placement sequence may include updating, based on the new reward and the new cost for the given well placement sequence, the reward distribution for each of the well placement sequences within a threshold distance of the given well placement sequence.

In some of those embodiments, each of the plurality of actions may be associated with each of the well placement sequences, and the method may further include storing the association of each of the actions with each of the well placement sequences in one or more databases, and prior to executing the computer-implemented simulation for a given well placement sequence, retrieving, from one or more of the databases, the association of each of the actions with each of the well placement sequences.

In some of those embodiments, the method may further include prior to executing the computer-implemented simulation on each of the well placement sequences in the set: determining a number of well placement sequences in the set of well placement sequences, and in response to determining the number of well placement sequences in the set of well placement sequences exceeds a threshold number of well placement sequences, processing the well placement sequences to reduce the number of well placement sequences in the set.

In some of those further embodiments, processing the well placement sequences to reduce the number of well placement sequences in the set may include receiving, from a user, one or more decision parameters, the one or more decision parameters including at least a distance parameter, calculating a pairwise distance for each well placement sequence in the set, calculating a distance for each of the well placement sequences to reach one or more of the areas of interest indicative of predicted hydrocarbon saturation, and reducing, based on the calculating, the number of well placement sequences in the set by removing a particular well placement sequences when: the pairwise distance is less than the distance parameter, or the distance to reach one or more of the areas of interest indicative of predicted hydrocarbon saturation is greater than the distance parameter.

In some embodiments, receiving the set of well placement sequences may include receiving a plurality of well placement locations from a user, and generating the set of well placement sequences based on the received well placement locations.

Consistent with another aspect of the invention, a method implemented by one or more processors is provided, the method includes generating a set of well placement sequences for placing wells in a geographical region, each well placement sequence in the set defining a sequence of multiple wells to be placed within the geographical region, and obtaining one or more actions. The one or more of the actions are associated with each of the generated well placement sequences in the set. The method further includes iteratively providing each of the well placement sequences in the set to execute a computer-implemented simulation on each of the well placement sequences in the set using the associated one or actions to determine, for each of the well placement sequences, an initial reward distribution based upon a calculated hydrocarbon recovery for each of the well placement sequences, storing, for each of the well placement sequences in the set, the initial reward distribution in one or more databases, selecting, based on the initial reward distributions and using an upper confidence bound algorithm, a given well placement sequence in the set to perform a further computer-implemented simulation with the given well placement sequence, and updating, in one or more of the databases, the initial reward distribution corresponding to the given well placement sequence to obtain an updated reward distribution for the given well placement sequence.

In some embodiments, the method further includes obtaining an action space corresponding to the geographical region, the action space being an n dimensional representation of the geographical region, and the action space including one or more areas of interest indicative of predicted hydrocarbon saturation, where n is a positive integer.

In some of those embodiments, the method may further include providing, to the simulator, the action space and the provided well placement sequence. The simulator may be configured, to execute the computer-implemented simulation, based on the action space and the provided well placement sequence. In some of those embodiments, the method further includes receiving, for each of the well placement sequences in the set, and from the configured simulator for a given time step: the reward for each of the actions, at the given time step, based upon the calculated hydrocarbon recovery for the well placement sequence, and the cost of the calculated hydrocarbon recovery for each of the actions, at the given time step, for the well placement sequence. In some of those embodiments, the method may further include determining, based on the reward and the cost for each of the actions, a reward distribution.

In some further embodiments, the method may further include, until convergence of the upper confidence bound algorithm, selecting, based on the reward distribution for each of the well placement sequences in the set, a given well placement sequence, receiving, from the configured simulator and for the given well placement sequence at the given time step: a new reward for each of the actions, at the given time step, based upon the calculated hydrocarbon recovery for the given well placement sequence, and a new cost of the calculated hydrocarbon recovery for each of the actions, at the given time step, for the given well placement sequence. In some further embodiments, the method may further include updating, based on the new reward and the new cost for the given well placement sequence, the reward distribution for the given well placement sequence to generate an updated reward distribution for the given well placement sequence.

In some of those further embodiments, convergence may be based on one or both of: a threshold number of computer-implemented simulations being executed, and a confidence threshold for a particular reward distribution corresponding to a particular well placement sequence being exceeded. In some of those further embodiments, updating the reward distribution for the given well placement sequence may further include updating, based on the new reward and the new cost for the given well placement sequence, the reward distribution for each of the well placement sequences within a threshold distance of the given well placement sequence.

In some embodiments, the method may further include prior to iteratively providing each of the well placement sequences in the set to the simulator: determining a number of well placement sequences in the set of well placement sequences; and in response to determining the number of well placement sequences in the set of well placement sequences exceeds a threshold number of well placement sequences, processing the well placement sequences to reduce the number of well placement sequences in the set.

In some of those embodiments, processing the well placement sequences to reduce the number of well placement sequences in the set may include receiving, from a user, one or more decision parameters, the one or more decision parameters including at least a distance parameter, calculating a pairwise distance for each well placement sequence in the set, calculating a distance for each of the well placement sequences to reach one or more of the areas of interest indicative of predicted hydrocarbon saturation, and reducing the number of well placement sequences in the set by removing a particular well placement sequences when: the pairwise distance is less than the distance parameter between wells, or the distance to reach one or more of the areas of interest indicative of predicted hydrocarbon saturation is greater than the distance parameter.

In some embodiments, generating the set of well placement sequences may include receiving a plurality of well placement locations from a user, and generating the set of well placement sequences based on the received well placement locations.

Consistent with yet another aspect of the invention, a system having at least one processor, and at least one storage device that stores instructions that, when executed, cause the at least one processor to receive a set of well placement sequences for placing wells in a geographical region, each well placement sequence in the set defining a sequence of multiple wells to be placed within the geographical region, execute a computer-implemented simulation on each of the well placement sequences in the set to determine, for each of the well placement sequences, a reward based upon a calculated hydrocarbon recovery for the well placement sequence and a cost of the calculated hydrocarbon recovery, and iteratively select well placement sequences upon which to execute computer-implemented simulations from among the plurality of well placement sequences using an upper confidence bound algorithm and based upon the rewards determined for each of the plurality of well placement sequences.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Figure 1A:
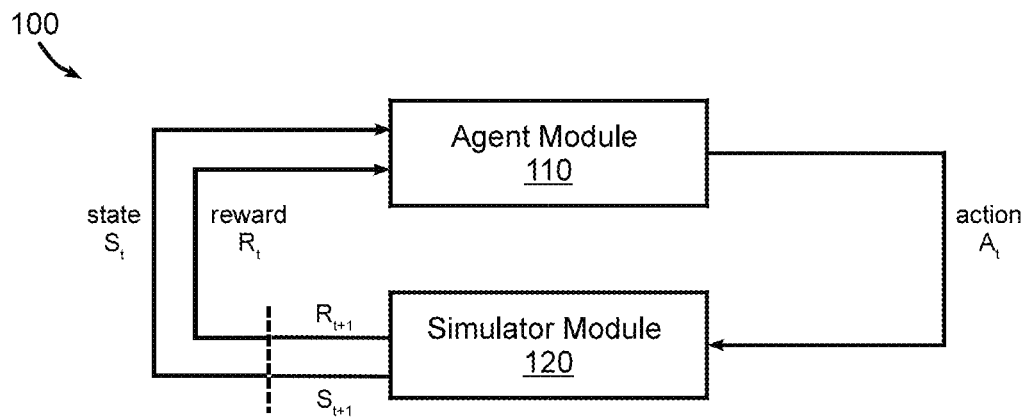
FIG. 1A is a high-level block diagram of an example agent-simulator environment consistent with some embodiments of the invention.

In some embodiments, a set of well placement sequences can be generated based on a multi-dimensional (e.g., a two dimensional, three dimensional, or four dimensional) action space, such that the set of well placement sequences includes all possible well placement sequences across the multi-dimensional action space. A given well placement sequence in the set can include two or more oil wells to be placed at a given time step in the action space representing the geographical region. At each time step in a simulation of the well placement sequence, an action (e.g., move a drilling rig for a potential well placement in a particular direction, drill a well at the potential well placement at a given location, or do nothing) for the well placement sequence is simulated to determine a reward based upon a calculated hydrocarbon recovery and a cost of the calculated hydrocarbon recovery. Alternatively, in some other embodiments, well placement locations can be directly provided to the agent-simulator environment by a user, and a set of well placement sequences can be generated based on the well placement locations directly provided by the user. In some embodiments, the action space can further include one or more areas of interest. In some of those embodiments, each of the one or more areas of interest indicate various levels of predicted hydrocarbon saturation. The areas of interest can be represented as a probabilistic map that indicates various levels of the predicted hydrocarbon saturation, and each simulation can utilize this probabilistic map for the predicted hydrocarbon saturation to calculate the reward and the cost for each simulation, both of which are used to determine the reward distribution for a given well placement sequence.

As noted above, the calculated hydrocarbon recovery and the cost of the calculated hydrocarbon recovery are disclosed herein as being calculated at a given time step during each simulation. However, it should be understood that each simulation has a fixed duration of time based on a period of a desired well placement plan (i.e., 5 years, 10 years, 20 years), and that the calculated hydrocarbon recovery and the cost of the calculated hydrocarbon recovery are dynamic over this fixed duration of time for each simulation (i.e., the period of the desired well placement plan). Accordingly, the calculated hydrocarbon recovery and the cost of the calculated hydrocarbon recovery at each given time step represents a static instance over this dynamic period. In other words, by using these static instances to determine the calculated hydrocarbon recovery and the cost of the calculated hydrocarbon recovery, the agent-simulator environment appears to be time agnostic.

One or more actions can be associated with each of the well placement sequences in the set, thereby creating a data structure corresponding to well-action sequences. The well-action sequences can be stored in one or more databases that are accessible by an agent and a simulator of the agent-simulator environment. In some embodiments, one or more of the databases may store additional data about a given well placement sequence, such as a reward distribution for the given well placement sequence. In some of those embodiments, the reward distributions can be iteratively updated based on each simulation. Although the reward based upon the calculated hydrocarbon recovery, the cost of the calculated hydrocarbon recovery, and the reward distributions disclosed herein are discussed as being iteratively updated based on each simulation, it should be understood that each simulation disclosed herein may be a combination of various simulations. For example, each simulation in the agent-simulator environment can include, but is not limited to a combination of geomechanical simulations, economical simulations, flow assurance simulations, and other reservoir simulations.

The agent-simulator environment models a reinforcement learning environment. The agent of the agent-simulator environment interacts with a simulator of the agent-simulator environment, and the objective of the agent is to minimize the number of interactions between the agent and the simulator while maximizing the eventual reward of a chosen well placement sequence. Accordingly, by using the agent, a number of simulations required to select a particular well placement sequence as an optimal well placement sequence is reduced and efficiency in selecting the optimal well placement sequence is increased. The simulator of the agent-simulator environment is configured using the action space representing the geographical region, and configured using a given well placement sequence selected by the agent.

For each agent-simulator interaction, the agent selects a given well placement sequence to provide to the simulator. The simulator can simulate each action for the given well placement sequence to generate, for each action, a simulator observation. Each simulator observation includes a determined reward based upon a calculated hydrocarbon recovery for a given action, a determined cost of the calculated hydrocarbon recovery for the given action, and an updated state of the simulator for the given well placement sequence. After each simulator observation, a reward distribution for the given well placement sequence can be updated based on the determined reward and the determined cost, and the state of the simulation can be discarded. Accordingly, each action for a given well placement sequence can be simulated before the agent selects another well placement sequence to provide to the simulator.

In some embodiments, a modified UCB algorithm is implemented by the agent in the agent-simulator environment, while in other embodiments, the modified UCB algorithm may be implemented by another computing system or device that is in communication with the agent of the agent-simulator environment. Initially, the agent may iteratively provide each well placement sequence in the set to the simulator to establish an initial reward distribution for each of the well placement sequences in the set by simulating each action for each of the well placement sequences. Based on the initial reward distributions, the agent can select a given well placement sequence with an initial reward distribution that maximizes:

$$Q(j) + \sqrt{\frac{2\log(n)}{n_j}} \quad \text{(Equation 1)}$$

where $Q(j)$ is a reward distribution corresponding to the jth well placement sequence, where n is the total number of well placement sequences chosen by the agent, and where $n_j$ is the total number of times the jth well placement sequence has been chosen by the agent. In addition to updating the reward distribution $Q(j)$ based on the determined reward and the determined cost after each simulator observation, values for n and $n_j$ may be updated after each of the actions for the jth placement sequence are simulated, and before the agent selects another well placement sequence.

In some embodiments, only a reward distribution for a given well placement sequence that was selected by the agent may be updated. In some other embodiments, the reward distribution for the given well placement sequence and reward distributions for one or more additional well placement sequences may be updated based on one or more weights. In some of those other embodiments, the one or more weights (e.g., an updated based on ½ or ¼ of the reward for the given well placement sequence) can be made based on a distance from the given well placement sequence to one or more of the additional well placement sequences, where the distance can be computed based on a minimum sum of pairwise distances. For example, for a particular well placement sequence that has never been explored but has two nearby well placement sequences that have been explored, the reward distribution of the particular well placement sequence can be a weighted average of the reward distributions for the two nearby well placement sequences, where a higher weight is given to a closer one of the two nearby well placement sequences.

Accordingly, by implementing the modified UCB algorithm, the agent may iteratively select well placement sequences from the set based on information learned between each simulation, and update reward distributions for one or more of the well placement sequences in the set after each simulation of a given well placement sequence. The agent-simulator environment can continue the process of selecting a given well placement sequence, simulating each action for the given well placement sequence, updating the reward distribution for the given well placement sequence (and optionally one or more of the additional well placement sequences as disclosed herein), and selecting another well placement sequence (i.e., the given well placement sequence or another well placement sequence in the set) that maximizes Equation 1 until convergence.

In some embodiments, convergence can be based on a threshold number of selections from the set of well placement sequences by the agent. For example, the agent may select the $1000^{th}$ selected well placement sequence as the optimal well placement sequence n=1000). In some other embodiments, convergence can be based on a threshold number of selections of a given well placement sequence by the agent. For example, the agent may select a particular well placement sequence that has been selected by the agent 100 times as the optimal well placement sequence regardless of a total number of selections (i.e., $n_j$=500). In some other embodiments, convergence can be based on a confidence threshold associated with a reward distribution for a given well placement sequence. For example, if a reward distribution for a given well placement sequence remains constant (or within a threshold amount) across a threshold number of iterations, then the agent may select the given well placement sequence as the optimal well placement sequence.

Optionally, in some embodiments and prior to initiating the simulator, the agent can reduce the number of well placement sequences in the action space by pre-processing the set of well placement sequences using one or more decision parameters. For example, a number of potential well placement sequences in the action space can be reduced using a distance parameter value in pre-processing the set of well placement sequences, thereby removing each of the well placement sequences in the set with a pairwise distance less than the distance parameter value. As another example, a number of well placement sequences in the action space can be reduced using a cost parameter value in pre-processing the set of well placement sequences, thereby removing each of the well placement sequences in the set with a cost required to traverse a given well placement sequence that is greater than the cost parameter value.

In other words, a given well placement sequence can be removed from the set if a given well placement sequence is too far from a desired one of the one or more areas of interest to be an optimal well placement sequence. In some of those embodiments, the cost parameter value can be based on each of the one or more areas of interest that indicate various levels of predicted hydrocarbon saturation. For example, a given well placement sequence can be removed from the set if a cost associated with a distance required to traverse the given well placement sequence to a desired one of the one or more areas of interest that indicate various levels of predicted hydrocarbon saturation is greater than the cost parameter value. In some of those embodiments, the cost parameter value can additionally and/or alternatively be based on time. For example, a given well placement sequence can be removed from the set if a cost associated with a time required to traverse the given well placement sequence to a desired one of the one or more areas of interest that indicate various levels of predicted hydrocarbon saturation is greater than the cost parameter value.

Further, in some of those embodiments, whether the agent implements the pre-processing steps is based on a threshold number of well placement sequences. For example, the agent can perform the pre-processing if the number of well placement sequences in the set exceeds 50, 100, 200, etc. In some of those embodiments, the pre-processing can be implemented using only one of the distance parameter value or the cost parameter value, or both of the distance parameter value and the cost parameter value. Further, if implemented using both the distance parameter value and the cost parameter value, the pre-processing can be executed in a serial or parallel fashion.

Optionally, in some embodiments and prior to initiating the simulator, one or more constraints can be placed on the action space in the agent-simulator environment. For example, a given constraint can be defined as a constant, fixed number of actions to choose from for a particular well placement sequence at each time step in a simulation, thereby reducing computational resources. As another example, a given constraint can be defined as a number of available drilling rigs, thereby defining a number of well placements to include in each well placement sequence. As yet another example, a given constraint can be defined as an amount of capital expenditure, thereby eliminating a given well placement between simulations if the determined cost exceeds the amount of capital expenditure.

Accordingly, by using claimed techniques, and for each simulation after the initial reward distribution for each well placement sequence in the set is determined, selection of a given well placement sequence to be simulated may depend on each prior simulation. This dependency enables an optimal well placement sequence to be selected with fewer interactions in an agent-simulator environment. As a result of fewer interactions between an agent and simulator in the agent-simulator environment and quicker convergence to an optimal well placement sequence, both computational and network resources may be conserved. Moreover, if pre-processing operations are implemented, then a number of well placement sequences in a set can be reduced, thereby also reducing a number of simulations to select an optimal well placement sequence and a level of complexity of the simulations. As a result of the pre-processing operations, both computational and network resources may be conserved. Further, by using the modified UCB algorithm and simulating each action for a selected well placement sequence, a more accurate reward distribution for each well placement sequence in the set may be obtained even though a number of interactions between the agent and the simulator are reduced. By obtaining a more accurate reward distribution for each well placement sequence across fewer interactions, the claimed techniques provide a more efficient manner of selecting an optimal well placement sequence as compared to known techniques.

Turning now to the drawings, wherein like numbers denote like parts throughout the several views, FIG. 1A illustrates a high-level block diagram of an agent-simulator environment 100. The agent-simulator environment includes an agent module 110 and a simulator module 120. The agent module 110, the simulator module 120, and the interaction there between is described in more detail herein (e.g., as described in FIG. 1B). Generally, the agent module 110 can provide an action $A_t$ for a given well placement sequence to the simulator module 120 at time t. Further, the simulator module 120 can determine, for the given well placement sequence, a reward $R_{t+1}$ based on a calculated hydrocarbon recovery at time t+1 (i.e., after action $A_t$ taken at time t) and an updated state $S_{t+1}$ of the simulator module 120 based on the action $A_t$ taken at time t.

In some embodiments, a reward distribution $R_t$ and a simulator state $S_t$ for the given well placement sequence may be updated in one or more databases. In some of those embodiments, and after the updating, the reward distribution $R_t$ and the simulator state $S_t$ for the given well placement sequence may be discarded. The reward distribution $R_t$ and the simulator state $S_t$ for the given well placement sequence may then be provided to the agent module 110. In some embodiments, the agent module 110 may select another action $A_{t+1}$ for the given well placement sequence, or select another well placement sequence.

Figure 1B:
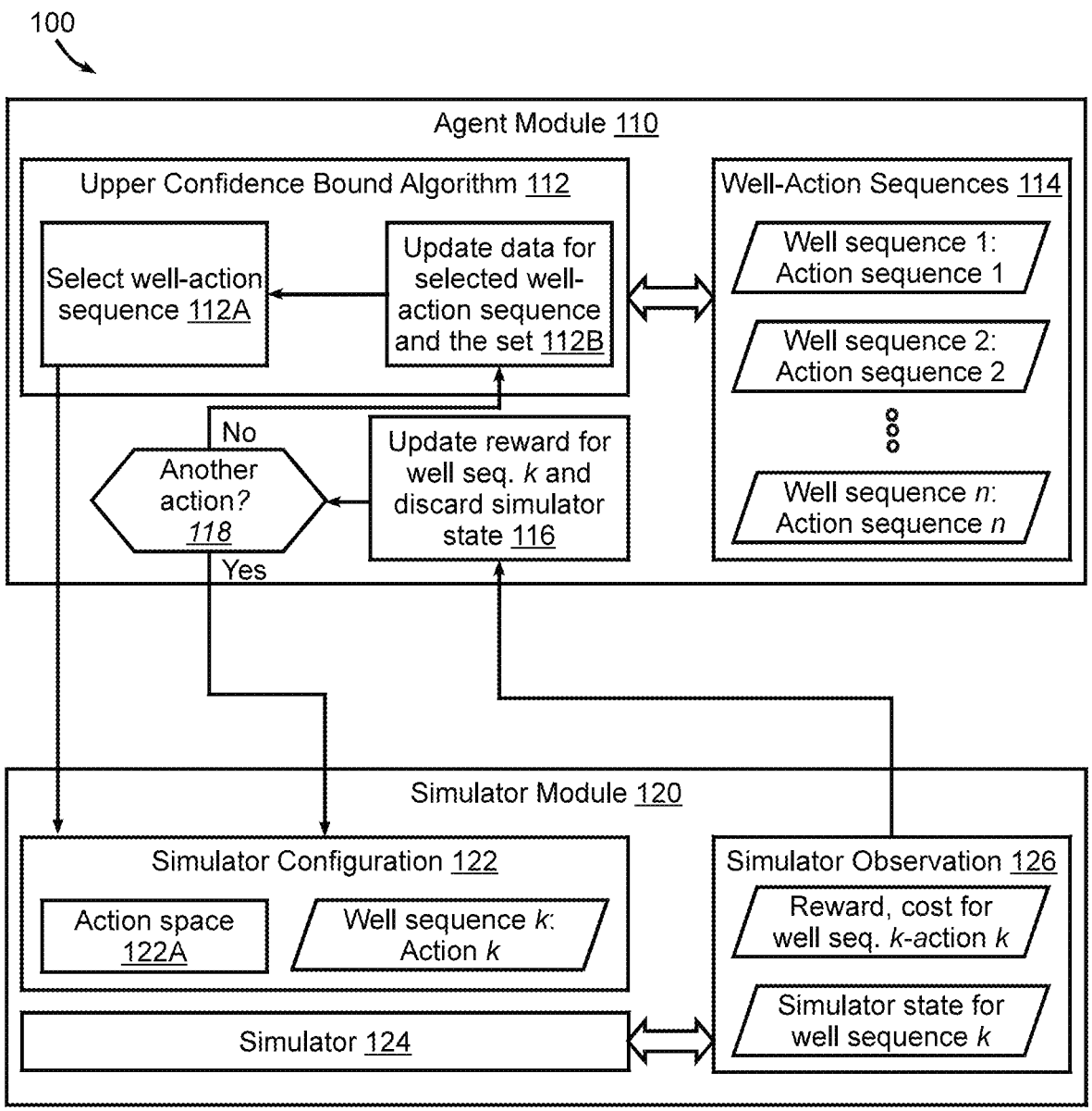
FIG. 1B is a detailed block diagram of an example agent-simulator environment consistent with some embodiments of the invention.

More particularly, FIG. 1B illustrates a detailed block diagram of the agent-simulator environment 100 of FIG. 1A. The agent-simulator environment 100 includes at least an agent module 110 and a simulator module 120. The agent module 110 is configured to implement a modified Upper Confidence Bound (UCB) algorithm 112 to interact with the simulator module 120 in the agent-simulator environment 100. The agent module 110 is further configured to generate well-action sequences 114 using data from one or more databases. For example, each of the well placement sequences of the set can be stored in one or more of the databases (e.g., well sequences 232 of FIG. 2) and associated with one or more actions stored in one or more of the databases (e.g., actions 234 of FIG. 2). This association can be performed by the agent module 110 and results in the well-action sequences 114, which include Well sequence 1: Action sequence 1, Well sequence 2: Action sequence 2, . . . , Well sequence n: Action sequence n, where n is based on a number of well placement sequences in the set.

As described in more detail herein (e.g., with respect to FIG. 4), the agent module 110, in implementing the modified UCB algorithm 112, can select a given well-action sequence and provide it to simulator configuration 122 of the simulator module 120. This selecting and providing of the given well-action sequence can be considered an interaction between the agent module 110 and the simulator module 120. In some embodiments, simulator configuration 122 may configure a simulator 124 using an action space 122A and the selected Well sequence k: Action k, where the action space 122A is an n dimensional representation (e.g., two dimensional, three dimensional, or four dimensional) of a graphical region where the oil wells of well-action sequence k are to be placed, and where k is an integer between 1 and n. In other embodiments, simulator configuration 122 may configure the simulator 124 using only one of the action space 122A and the selected Well sequence k: Action k.

Figure 6A:
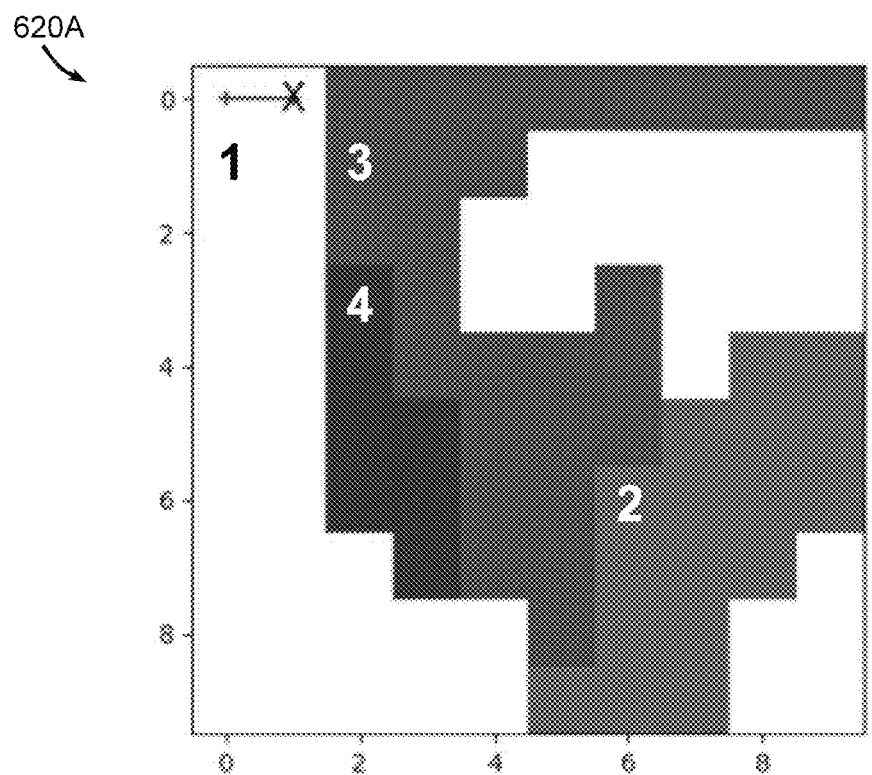
FIG. 6A is an exemplary action space including various areas of interest indicative of predicted hydrocarbon saturation consistent with some embodiments of the invention.
Figure 6B:
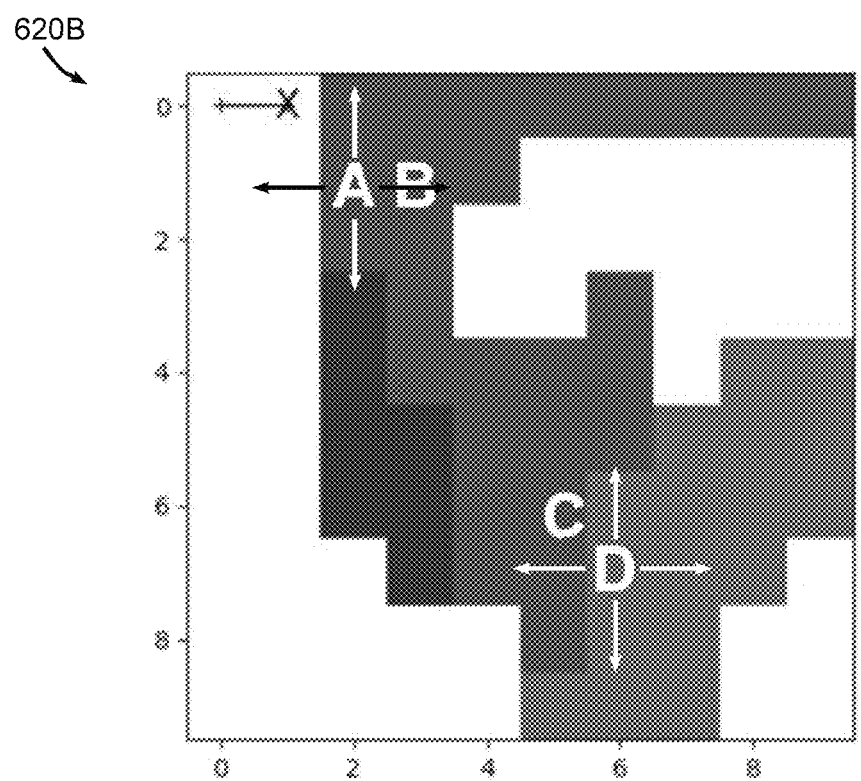
FIG. 6B is the exemplary action space of FIG. 6A including a set of well placement sequences consistent with some embodiments of the invention.

Once configured, the simulator 124 of the simulator module 120 can perform a simulation to generate a simulator observation 126. To generate the simulator observation 126, the simulator 124 can simulate Action k in the action space 122A for Well sequence k. By simulating Action k for Well sequence k, the simulator can determine a reward and cost for Well sequence k in response to performing Action k. The reward can be based upon an amount of calculated hydrocarbon recovery for Well sequence k given simulated Action k. In some embodiments, the amount of calculated hydrocarbon recovery is based on a flow simulation. In those embodiments, the flow simulation can be based on data generated by one or more sensors (e.g., sensors 270A-270N of FIG. 2) and provided to the simulator module 120 (e.g., via network 280 of FIG. 2) that are physically located in a geographical region that corresponds to action space 122A. In some embodiments, the flow simulation can be based on different levels of predicted hydrocarbon saturation in a given region of the action space 122A (e.g., as shown in FIGS. 6A and 6B) and omit data generated by the one or more sensors. The cost can be based upon a cost of the calculated hydrocarbon recovery (e.g., cost to move an oil well in Well sequence k, cost to drill at a location corresponding to an oil well in Well sequence k, etc.).

Moreover, the simulator observation 126 includes a simulator state for Well sequence k after Action k is performed. The simulator state allows the agent module 110 to keep track of which actions have been simulated for Well sequence k, and any other well placement sequence. Notably, the simulation can only perform one action (Action k) at a given time step of the simulation for Well sequence k. However, there is generally more than one action associated with a given well-action sequence. Accordingly, the simulator module 120 can provide the simulator observation 126 to the agent module 110, and the agent module 110 can store and/or update a reward distribution for Well sequence k and various artifacts of the observed simulator state can be discarded, such as Well sequence k and discard the observed simulator state.

The agent module 110 can determine if there is another action 118 in Action sequence k (corresponding to Well sequence k) that has not been simulated. If the agent module 110 determines there is another action 118, then the agent module 110 can provide the action to the simulator configuration 122 to configure the simulator 124 for the another action 118 for Well sequence k. This process may continue until each action in Action sequence k is simulated for Well sequence k. If the agent module 110 determines there is not another action 118, then the agent module 110 may update data related to the UCB algorithm 112 for the selected Well sequence k: Action sequence k and the set 112B. In some embodiments, the agent module 110 can update a number of times Well sequence k: Action sequence k has been selected by the agent module 110 using the UCB algorithm 112 (i.e., $n_j$ in Equation 1, where k=j in this example). In some of those embodiments, the agent module 110 can also update a total number of selections of well-action sequences by the agent module 110 using the UCB algorithm 112 (i.e., n in Equation 1).

The agent module 110, using the UCB algorithm 112, can then select another well-action sequence 112A for simulation. As described in more detail herein (e.g., with respect to FIG. 4), the agent module 110 may sequentially select each of the well-action sequences 114 in the set to determine an initial reward distribution for each of the well-action sequences 114. After each of the initial reward distributions are determined, the agent module 110 can implement the UCB algorithm 112 to iteratively select well-action sequences 114 that maximize Equation 1. By iteratively selecting well-action sequences 114 that maximize Equation 1 and simulating actions for a corresponding well placement sequence, a number of interactions between the agent module 110 and the simulator module 120 can be reduced. Accordingly, both computational and network resources can be reduced, and an optimal well placement sequence can be obtained more efficiently as compared to known methods.

Although various components and/or operations of FIG. 1B are illustrated as being implemented by the agent module 110 and the simulator module 120, that is not meant to be limiting. In some embodiments, one or more of the components and/or operations of FIG. 1B may be implemented remotely (e.g., servers 260A-260N of FIG. 2). In some other embodiments, one or more of the components and/or operations of FIG. 1B may be implemented by another computing device in communication (e.g., via a local connection) with the agent module 110 and/or simulator module 120.

Figure 2:
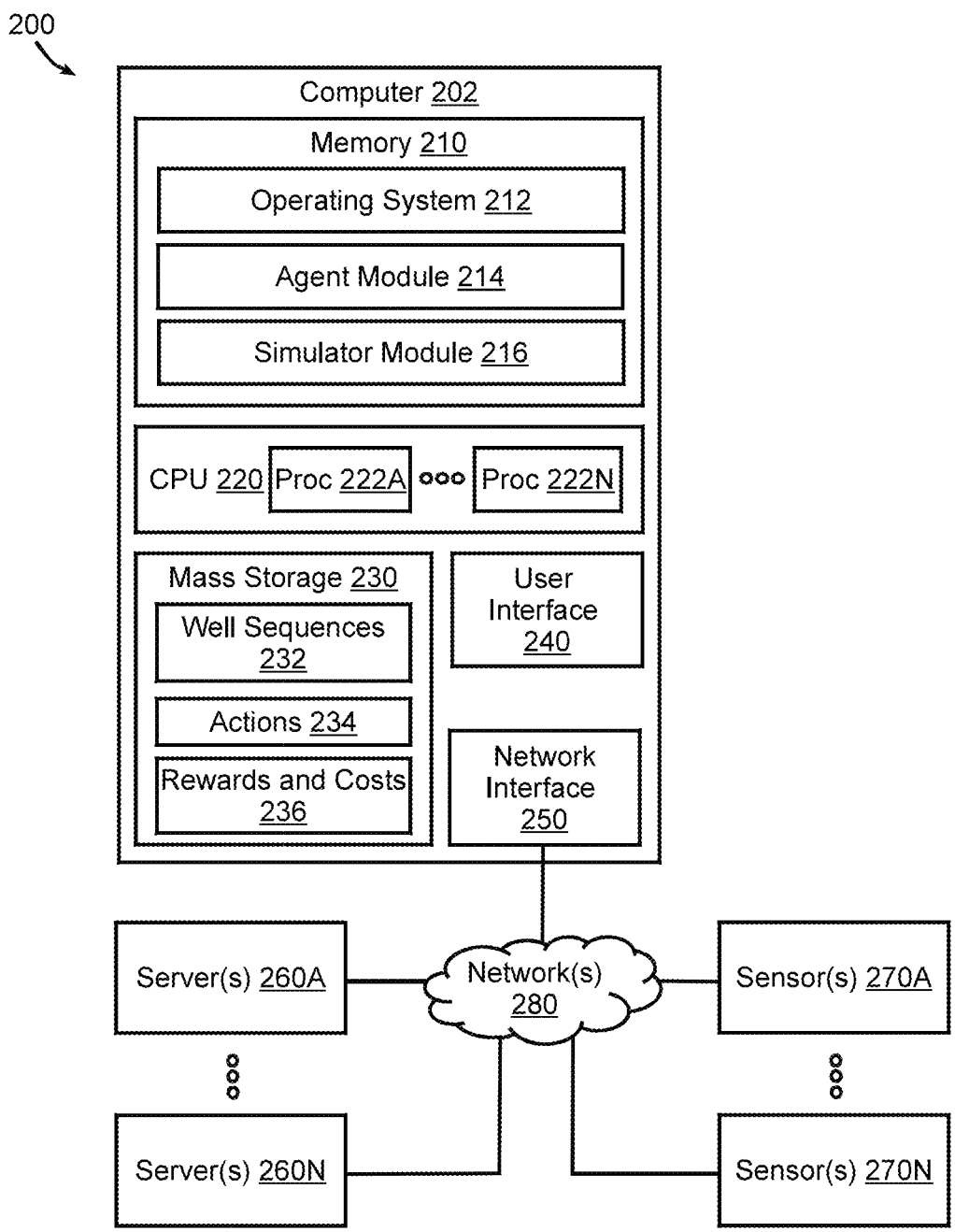
FIG. 2 is a block diagram of an example hardware and software environment for a data processing system consistent with some embodiments of the invention.

Now turning to FIG. 2, a block diagram of an example hardware and software environment for a data processing system 200 is shown. The system 200 is illustrated as a computer 202, e.g., client computers, each including a central processing unit (CPU) 220 including at least one hardware-based processor or processing core 222A-222N. CPU 220 is coupled to a memory 210, which may represent the random access memory (RAM) devices comprising the main storage of a computer 202, as well as any supplemental levels of memory, e.g., cache memories, non-volatile or backup memories (e.g., programmable or flash memories), read-only memories, etc. In addition, memory 210 may be considered to include memory storage physically located elsewhere in a computer 202, e.g., any cache memory in a microprocessor or processing core, as well as any storage capacity used as a virtual memory, e.g., as stored on a mass storage device 230 or on another computer coupled to a computer 202.

The computer 202 also generally receives a number of inputs and outputs for communicating information externally. For interface with a user or operator, a computer 202 generally includes a user interface 240 incorporating one or more user input/output devices, e.g., a keyboard, a pointing device, a display, a printer, etc. Otherwise, user input may be received, e.g., over a network interface 250 coupled to a network 280, from one or more external computers, e.g., one or more servers 260A-260N. The computer 202 also may be in communication with one or more mass storage devices 230, which may be, for example, internal hard disk storage devices, external hard disk storage devices, storage area network devices, etc.

The computer 202 generally operates under the control of an operating system 212 and executes or otherwise relies upon various computer software applications, components, programs, objects, modules, data structures, etc. For example, an agent module 214 and a simulator module 216 executed by the operating system 212 may be used to access, process, generate, modify, update or otherwise utilize data in mass storage 230 (e.g., as stored locally in a well placement sequences database 232, actions database 234, rewards and costs database 236), data accessible remotely over one or more servers 260A-260N via network 280, and/or data from one or more sensors 270A-270N placed in an oilfield via network 280. It will be appreciated that each server 260A-260N may incorporate a CPU, memory, and other hardware components similar to the computer 202.

In one non-limiting embodiment, for example, the agent module 214 and the simulator module 216 may be implemented in simultaneously by the computer 202 to create an agent-simulator environment that models a reinforcement learning environment (e.g., as described with respect to FIGS. 1A and 1B). As another non-limiting embodiment, for example, the agent module 214 and the simulator module 216 may be implemented simultaneously using both the computer 202 and one or more of the servers 260A-260N over one or more networks 280. It will be appreciated, however, that the techniques discussed herein may be utilized in connection with other platforms and environments, so the invention is not limited to the particular software platforms and environments discussed herein.

Moreover, it will be appreciated that the herein-described techniques may be implemented in a number of different computers, computer systems, devices, etc. While embodiments have and hereinafter will be described in the context of fully functioning computers and computer systems, those skilled in the art will appreciate that the various embodiments are capable of being distributed as a program product in a variety of forms, and that the invention applies equally regardless of the particular type of computer readable media used to actually carry out the distribution.

Such computer readable media may include computer readable storage media and communication media. Computer readable storage media is non-transitory in nature, and may include volatile and non-volatile, and removable and non-removable media implemented in any method or technology for storage of information, such as computer-readable instructions, data structures, program modules or other data. Computer readable storage media may further include RAM, ROM, erasable programmable read-only memory (EPROM), electrically erasable programmable read-only memory (EEPROM), flash memory or other solid state memory technology, CD-ROM, DVD, or other optical storage, magnetic cassettes, magnetic tape, magnetic disk storage or other magnetic storage devices, or any other medium that can be used to store the desired information and which can be accessed by computer 202. Communication media may embody computer readable instructions, data structures or other program modules. By way of example, and not limitation, communication media may include wired media such as a wired network or direct-wired connection, and wireless media such as acoustic, RF, infrared and other wireless media. Combinations of any of the above may also be included within the scope of computer readable media.

Furthermore, it will be appreciated by those of ordinary skill in the art having the benefit of the instant disclosure that the various operations described herein that may be performed by any program code, or performed in any routines, workflows, or the like, may be combined, split, reordered, omitted, and/or supplemented with other techniques known in the art, and therefore, the invention is not limited to the particular sequences of operations described herein. Those skilled in the art will recognize that the example environment illustrated in FIG. 2 is not intended to limit the invention. Indeed, those skilled in the art will recognize that other alternative hardware and/or software environments may be used without departing from the scope of the invention.

Figure 3:
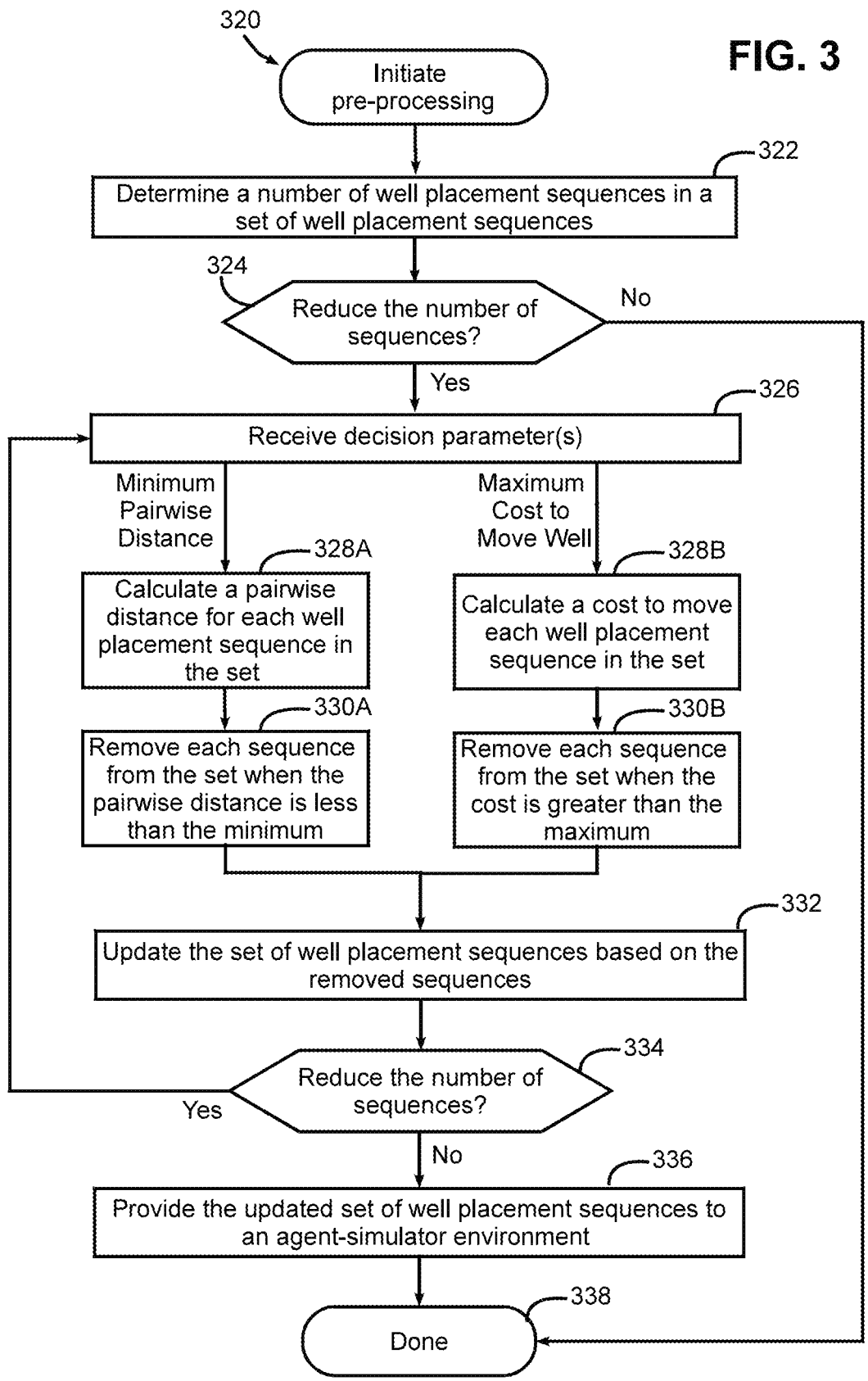
FIG. 3 is a flowchart illustrating an example method of pre-processing well placement sequences to reduce a number of the well placement sequences in an action space consistent with some embodiments of the invention.

Now turning to FIG. 3, a flowchart illustrating an example sequence of operations 320 of pre-processing well placement sequences to reduce the number of the well placement sequences in an action space is shown. For the sake of simplicity, sequence of operations 320 is discussed as being performed by a system (e.g., computer 202 and/or one or more servers 260A-260N of FIG. 2), although that should not be limiting. It should be understood that the sequence of operations 320 can be implemented by another computing device in communication with the agent-simulator environment operating on the computer (e.g., server(s) 260A-260N via a network 280 of FIG. 2, or the like).

At block 322, the system may determine a number of well placement sequences in a set. At block 324, the agent can determine whether to reduce the number of well placement sequences in the set. In some embodiments, the agent in the agent-simulator environment can automatically initiate the pre-processing based on a threshold number of well placement sequences in the set (e.g., initiate pre-processing if more than 100, 500, or 1000 well placement sequences in the set). In some other embodiments, the pre-processing can be manually initiated by a user (e.g., by user interface 240 of FIG. 2). If, at an iteration of block 324, the system determines not to reduce the number of well placement sequences in the set, then the sequence of operations 320 proceeds to block 338, and sequence of operations 320 ends. If, at an iteration of block 324, the system determines to reduce the number of well placement sequences in the set, then the sequence of operation 320 proceeds to block 326.

At block 326, the system may receive one or more decision parameters. The received decision parameters (e.g., via user interface 240 of FIG. 2) may include at least one of a distance parameter value and a cost parameter value. The number of well placement sequences in the set can be reduced based on: [A] a minimum pairwise distance; and [B] a maximum cost to move an oil well in a given well placement sequence.

At block 328A, the system may calculate a pairwise distance for each well placement sequence in the set, and at block 330A, the system may remove each well placement sequence from the set when the calculated pairwise distance is less than the distance parameter value. For example, the received distance parameter value may be three, and the calculated pairwise distance for a first well placement sequence may be four and the calculated pairwise distance for a second well placement sequence may be two. In this case, the second well placement sequence may be removed from the set because its corresponding pairwise distance of two is less than the distance parameter value of three, whereas the first well placement sequence will remain in the set.

At block 328B, the system may calculate a cost to move each well placement sequence in the set to a region that includes a desired saturation of hydrocarbons (discussed in more detail herein, e.g., with respect to FIG. 6A), and at block 330B, the system may remove each well placement sequence from the set when the calculated cost is greater than the cost parameter value. For example, the received cost parameter may be five, and the calculated cost for a first well placement sequence may be seven and the calculated pairwise distance for a second well placement sequence may be one. In this case, the first well placement sequence may be removed from the set because its corresponding cost of seven is greater than the cost parameter value of five, whereas the second well placement sequence will remain in the set. Moreover, if the pre-processing is implemented using both the distance parameter value and the cost parameter value, pre-processing using both [A] the minimum pairwise distance and [B] the maximum cost to move an oil well in a given well placement sequence can be executed in a serial or parallel fashion.

At block 332, the system may update the set of well placement sequences based on the removed sequences at blocks 330A and 330B. At block 334, the system may determine whether to further reduce the number of well placement sequences in the set. For example, the agent can determine to further reduce the number of well placement sequences in the updated set if the number of well placement sequences in the updated set exceeds the threshold number of well placement sequences. Alternatively, the system may receive user input (e.g., via user interface 240 of FIG. 2) indicating the user wishes to further reduce the number of well placement sequences in the updated set.

If, at an iteration of block 334, the system may determine to further reduce the number of well placement sequences in the updated set, the sequence of operations 320 may return to block 326 and receive new decision parameters (e.g., via user interface 240 of FIG. 2) that include at least one of a new distance parameter value and/or a new cost parameter value. If, at an iteration of block 334, the system determines the number of well placement sequences in the updated set is below the threshold, then the sequence of operations 320 may proceed to 336. At block 336, the system can provide the updated set of well placement sequences to the agent-simulator environment, and at block 338, sequence of operations 320 ends.

Figure 4:
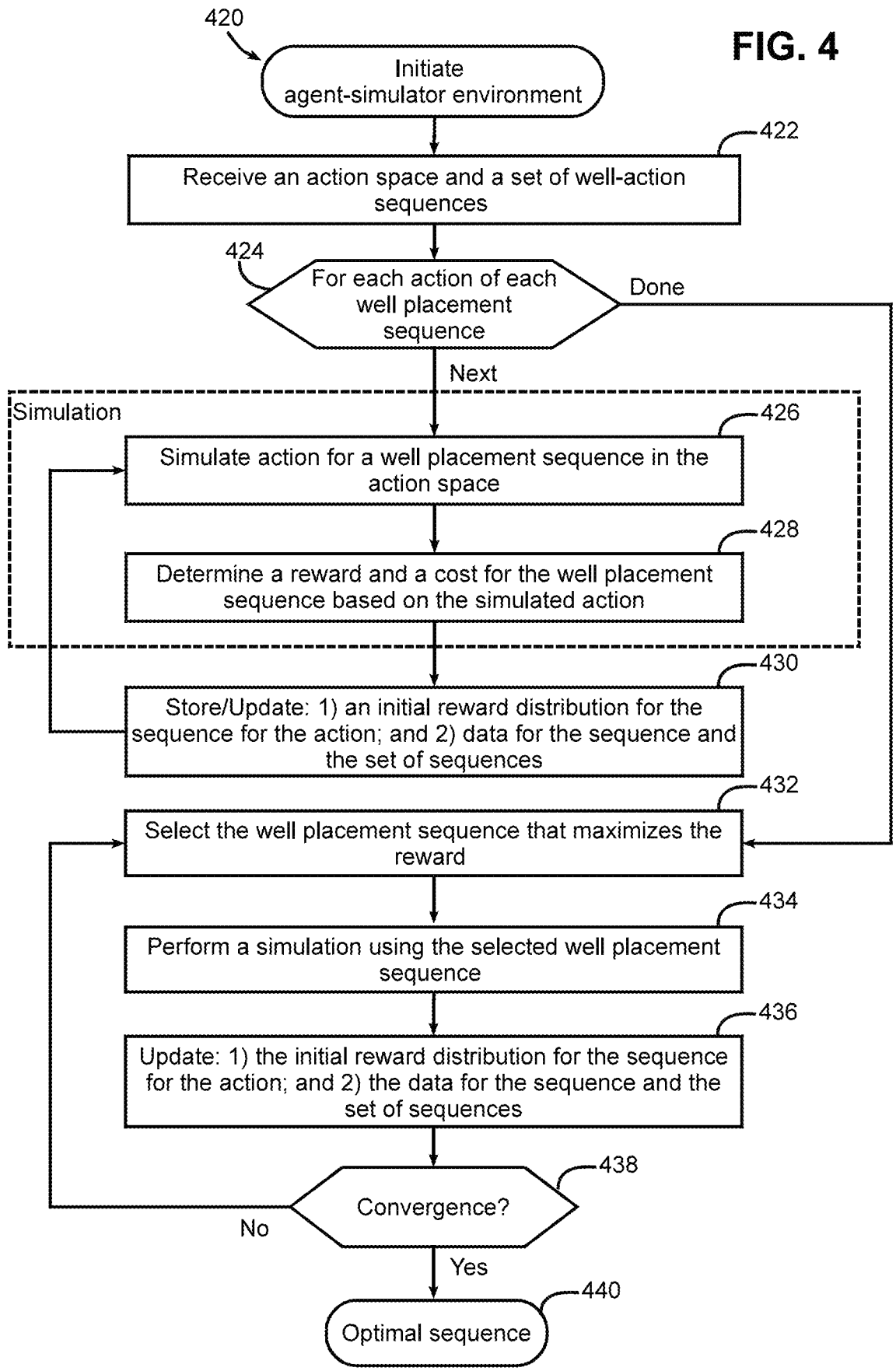
FIG. 4 is a flowchart illustrating an example method of selecting a well placement sequence using a modified Upper Confidence Bound algorithm in an agent-simulator environment consistent with some embodiments of the invention.

Now turning to FIG. 4, a flowchart illustrating an example sequence of operations 420 of selecting a well placement sequence using a modified UCB algorithm in an agent-simulator environment is shown. For the sake of simplicity, For the sake of simplicity, sequence of operations 420 is discussed as being performed by a system (e.g., computer 202 and/or one or more servers 260A-260N of FIG. 2), although that should not be limiting. It should be understood that the sequence of operations 420 can be implemented by another computing device in communication with the agent-simulator environment operating on the computer (e.g., server(s) 260A-260N via a network 280 of FIG. 2, or the like).

At block 422, the system may receive an action space and a set of well-action sequences. The action space can be an n dimensional representation (e.g., two dimensional, three dimensional, or four dimensional) of the geographical region for the agent-simulator environment, and correspond to the placement of a well in the geographical region. As described in more detail herein (e.g., with respect to FIGS. 6A and 6B), the action space may include a plurality of distinct areas of interest, where each of the distinct areas of interest indicate different levels of predicted hydrocarbon saturation in that region. The set of well-action sequences includes an association of each well placement sequence with one or more actions. As described in more detail herein (e.g., with respect to FIG. 1B), the action space and the set of well-action sequences can be utilized to configure a simulator. The set of well-action sequences can be stored in one or more databases of the system (e.g., such as those included in mass storage 230 of FIG. 2) and/or stored elsewhere and accessible over one or more networks 280.

At block 424, the system may initiate a FOR loop to determine an initial reward distribution for each well placement sequence in the set. For each such well placement sequence, block 424 passes control to block 426, where a first action is simulated in the action space for a given well placement sequence. For example, the simulated first action may be move each oil well in the given well placement sequence to the right. At block 428, and based on the simulated first action for the given well placement sequence, the system may determine a reward and a cost for the given well placement sequence. The reward is associated with a calculated hydrocarbon recovery given the first action, and the cost is associated with a cost of performing the first action. For example, if the simulated first action for the given well placement sequence is move each oil well in the given well placement sequence to the right, then the system may determine a reward and cost associated with moving each oil well in the given well placement sequence.

At block 430, the system may store: 1) an initial reward distribution for the given well placement sequence based on the determined reward and cost associated with the simulated first action for the given well placement sequence; and 2) data for the well placement sequence (e.g., how many simulations have been performed using the given well placement sequence) and the set of sequences (e.g., how many total simulations have been performed using the well placement sequences in the set). This information can be stored in one or more databases of the system (e.g., such as those included in mass storage 230 of FIG. 2) and/or stored elsewhere and accessible over one or more networks 280. If, at an iteration of block 430, the system determines there is another distinct action that has not been performed for a given well placement sequence, then control passes back to block 426.

At a subsequent iteration of block 426, a second action is simulated in the action space for the given well placement sequence. For example, the simulated second action may be move each oil well in the given well placement sequence to the left. At a subsequent iteration of block 428, and based on the simulated second action for the given well placement sequence, the system may determine a reward and a cost for the given well placement sequence. The reward is associated with a calculated hydrocarbon recovery given the second action, and the cost is associated with a cost of performing the second action. At a subsequent iteration of block 430, the system may update: 1) the initial reward distribution for the given well placement sequence based on the determined reward and cost associated with the simulated second action for the given well placement sequence; and 2) the data for the well placement sequence (e.g., how many simulations have been performed using the given well placement sequence) and the set of sequences (e.g., how many total simulations have been performed using the well placement sequences in the set).

This iterative process of updating the initial reward distribution continues for the given well placement sequence until each of the actions associated with the given well placement sequence in the set of well-action sequences are simulated and the initial reward distribution updated based on the simulated actions. Moreover, after each action is simulated for the given well placement sequence, each action may be simulated for each of the remaining well placement sequences in the set in a similar iterative manner. Accordingly, by initiating the FOR loop at block 424, the system may determine an initial reward distribution for each well placement sequence in the set. After the initial reward distribution is determined for each well placement sequence in the set, control passes to block 432.

At block 432, the system may select a well placement sequence in the set that maximizes Equation 1 (i.e., select the well placement sequence with the highest initial reward distribution). For example, if a first well placement sequence has an initial reward distribution of 0.4 and a second well placement sequence has an initial reward distribution 0.3, then the first well placement may be selected over the second well placement sequence at block 432. The system may access the one or more databases of the system (e.g., such as those included in mass storage 230 of FIG. 2) and compare the initial reward distributions for various well placement sequences in selecting the selected well placement sequence.

At block 434, the system may perform a simulation using the selected well placement sequence. The simulation performed at block 434 is substantially similar to the simulation performed at blocks 426 and 428, and as denoted by the dashed box. In performing the simulation using the selected well placement sequence, each of the actions associated with the selected well placement sequence in the set of well-action sequences are iteratively simulated. Between each simulated action for the selected well placement, and as shown at block 436, the initial reward distribution may be updated for the selected well placement sequence, and the data for the selected well placement sequence (e.g., how many simulations have been performed using the selected well placement sequence) and the set of sequences (e.g., how many total simulations have been performed using the well placement sequences in the set) may also be updated. This results in an updated reward distribution for the selected well placement sequence. After each action is simulated for the selected well placement sequence and the updated reward distribution is determined for the selected well placement sequence, control passes to block 438.

At block 438, the system may determine whether convergence is reached. In some embodiments, convergence can be based on a threshold number of selections from the set of well placement sequences by the agent. For example, the agent may select the $1000^{th}$ selected well placement sequence as the optimal well placement sequence (i.e., a given well placement sequence is the $1000^{th}$ selected well placement sequence). In some other embodiments, convergence can be based on a threshold number of selections of a given well placement sequence by the agent. For example, the agent may select a particular well placement sequence that has been selected by the agent 100 times as the optimal well placement sequence regardless of a total number of selections (i.e., a given well placement has been the selected well placement sequence 500 times). In some other embodiments, convergence can be based on a confidence threshold associated with the updated reward distribution for a given well placement sequence. For example, if the updated reward distribution for a given well placement sequence remains constant (or within a threshold amount) across a threshold number of iterations and the given well placement sequence is continually selected, then the agent may select the given well placement sequence as the optimal well placement sequence.

If, at an iteration of block 438, the system determines that convergence has not been reached, then the system may return to 432 to select an additional well placement sequence. Again, at block 432, the selected additional well placement sequence is the well placement sequence in the set that maximizes Equation 1 (i.e., select the well placement sequence with the highest initial/updated reward distribution). Accordingly, the selected additional well placement sequence may be the same well placement sequence as previously selected or a different well placement sequence. If, at an iteration of block 438, the system determines that convergence has been reached, then the system may proceed to block 440 and use the selected additional well placement sequence as an optimal well sequence.

Accordingly, by initially simulating actions for each well placement sequence in the set to determine an initial distribution for each of the well placement sequences in the set, and selecting a given well placement sequence in the set that maximizes Equation 1, the modified UCB algorithm is implemented in well placement planning. By using the modified UCB algorithm in well placement planning, each of the well placement sequences in the set can be explored as potential well placement sequences, and a single well placement sequence can be selected as an optimal well placement sequence for exploitation based on a corresponding reward distribution.

Figure 5:
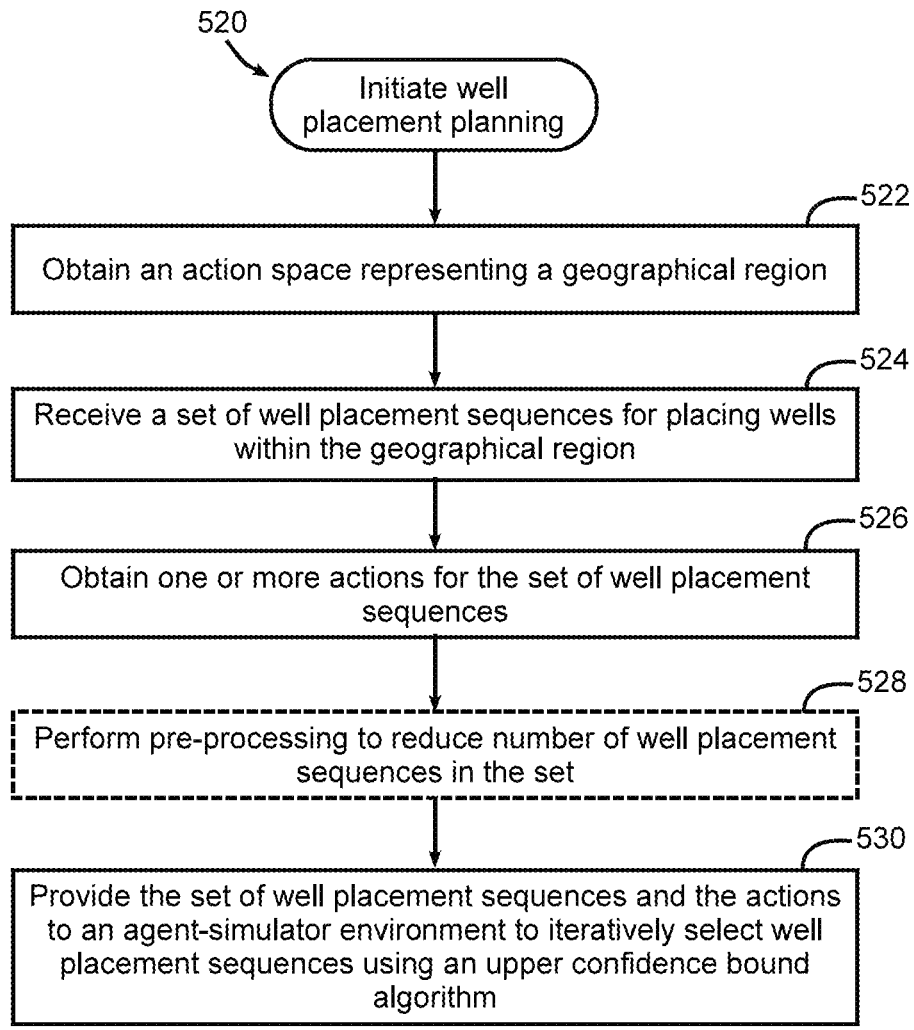
FIG. 5 is a flowchart illustrating an example method of well placement planning in an agent-simulator environment consistent with some embodiments of the invention.

Now turning to FIG. 5, a flowchart illustrating an example sequence of operations 520 of well placement planning is shown. For the sake of simplicity, sequence of operations 520 is discussed as being performed by a system (e.g., computer 202 and/or one or more servers 260A-260N of FIG. 2), although that should not be limiting. It should be understood that the sequence of operations 520 can another computing device in communication with the agent-simulator environment operating on the computer (e.g., server(s) 260A-260N via a network 280 of FIG. 2, or the like).

At block 522, the system may obtain an action space that represents a geographical region. The action space can be an n dimensional representation (e.g., two dimensional, three dimensional, or four dimensional) of the geographical region for the agent-simulator environment, and correspond to the placement of a well in the geographical region. As described in more detail herein (e.g., with respect to FIGS. 6A and 6B), the action space may include a plurality of distinct areas of interest, where each of the distinct areas of interest indicate different levels of predicted hydrocarbon saturation in that region.

At block 524, the system may receive a set of well placement sequences for placing wells within the geographical region. In some embodiments, the set of well placement sequences can be generated based on the obtained action space. In other embodiments, the set of well placement sequences can be generated based on well placement locations defined by a user via user interface 240 of FIG. 2. The generation of well placement sequences is described in more detail herein (e.g., with respect to FIGS. 6A and 6B).

At block 526, the system may obtain one or more actions for the set of well placement sequences. In some embodiments, each of the one or more actions can be associated with each well placement sequence in the set. In other embodiments, a subset of the one or more actions can be associated with each well placement sequence in the set. In either of those embodiments, the one or more actions can be associated with each of the well placement sequences in the set, thereby creating a set of well-action sequences. Accordingly, at each time step in simulating the actions for a given well placement sequence, one of the one or more actions is applied to the given well placement sequence, and a reward and/or cost associated with the action for the given well placement sequence can be calculated based upon a calculated hydrocarbon recovery.

At optional block 528, the system may perform pre-processing operations. By implementing the pre-processing operations (e.g., such as those described with respect to FIG. 3), a number of well placement sequences in the set can be reduced. As a result, reducing the number of well placement sequences in the set enables an exemplary system to consume less computational and/or network resources in performing simulations to arrive at an optimal well placement sequence as compared to known systems and operations. Moreover, reducing the number of well placement sequences in the set enables an exemplary system to converge to an optimal well placement sequence more quickly and efficiently as compared to known systems and operations.

At block 530, the system may provide the set of well placement sequences and the obtained actions to an agent-simulator environment to iteratively select well placement sequences using a modified UCB algorithm (e.g., such as described with respect to FIG. 4 in the environment described with respect to FIGS. 1A and 1B). A non-limiting working example is provided herein (e.g., described in FIGS. 6A and 6B) to provide an overview of various concepts described herein related to well placement planning (e.g., with respect to FIGS. 1A, 1B, 3, 4, and 5).

Now turning to FIGS. 6A and 6B, an exemplary action space 620A, 620B utilized by an agent-simulator environment during well placement planning is shown. The action space 620A, 620B can be used to configure a simulator in the agent-simulator environment. In some embodiments, the action space 620A, 620B can be provided directly to the agent-simulator environment by a user (e.g., via user interface 240 of FIG. 2). In other embodiments, the agent-simulator environment can generate the action space 620A, 620B based on sensor data from an oil field (e.g., via sensor(s) 270A-270N via a network 280 of FIG. 2). For example, once and oil field is located, sensors may be placed across the oil field, such as surface sensors and/or downhole sensors, and the agent-simulator environment can determine predicted hydrocarbon saturation across the oil field based on data received from the sensors. The sensors may be in communication with computer 202, or another computing device in communication with the agent-simulator environment operating on the computer (e.g., server(s) 260A-260N via a network 280 of FIG. 2, or the like). For the sake of brevity, it is assumed the action space 620A, 620B of FIGS. 6A and 6B is directly provided by a user.

Now turning specifically to FIG. 6A, the exemplary action space 620A, including various areas of interest indicative of predicted hydrocarbon saturation, is shown. As described herein, the action space can be a n dimensional representation (e.g., two dimensional, three dimensional, or four dimensional) of a geographical region of interest in the agent-simulator environment, where n is a positive integer, and corresponds to the placement of a well in the geographical region. For the sake of simplicity, the action space of FIG. 6A is a two dimensional 10×10 action space, and includes four distinct areas of interest, where each of the distinct areas of interest indicate different levels of predicted hydrocarbon saturation. In some embodiments, and as shown in FIG. 6A, darker areas of interest correspond to higher levels of predicted hydrocarbon saturation, although this is not meant to be limiting. For example, in other embodiments, darker areas of interest could correspond to lower levels of predicted hydrocarbon saturation.

Although FIGS. 6A and 6B are discussed in connection with a two dimensional 10×10 action space that is for the sake of simplicity and is not meant to be limiting. In some embodiments, the action space can be a three dimensional action space. In some of these embodiments, the third dimension can be depth that represents a depth of each of the areas of interest of the predicted hydrocarbon saturation. The depth of each of the areas of interest of the predicted hydrocarbon saturation can influence the calculated reward and cost (and the reward distribution as a result of influencing the calculated reward and cost) due to changes in pressure at various depths that can increase or decrease the flow of hydrocarbons during extraction. In some further embodiments, the action space can be a four dimensional action space. In some of these further embodiments, the fourth dimension can be time that represents a time when a given well in a well placement sequence is drilled. The time when the given well in the well placement sequence is drilled can also influence the calculated reward and cost (and the reward distribution as a result of influencing the calculated reward and cost). For example, the agent-simulator environment can model well placement planning over a long period of time (i.e., 5 years, 10 years, 20 years), and if the given well in the well placement sequence is drilled in year one, as opposed to year eight, then a calculated reward for a ten year well placement plan may be greater due to the seven year difference in extracting hydrocarbons.

As noted, the action space of FIG. 6A is a two dimensional 10×10 action space, and includes four distinct areas of interest. In particular, the shading of Region 1 (comprised of three regions with similar shading), or the lack thereof, indicates there is no predicted hydrocarbon saturation in Region 1 of the action space 620A; the shading of Region 2 indicates there is some predicted hydrocarbon saturation in Region 2 of the action space 620A; the shading of Region 3 indicates there is more predicted hydrocarbon saturation in Region 3 of the action space 620A than in Region 2; and the shading of Region 4 indicates there is the most predicted hydrocarbon saturation Region 4 of the action space 620A. Accordingly, the calculated hydrocarbon recovery, which is used to determine a reward for each simulation, can be based on a flow of the predicted hydrocarbon saturation in each of the areas of interest of action space 620A, and a cost can be based on the cost of drilling for the predicted hydrocarbons at the particular location.

Now turning specifically to FIG. 6B, the exemplary action space 620B (corresponding to the action space 620A of FIG. 6A), including a set of well placement locations and a set of actions, is shown. For the sake of brevity, decision parameters and constraints are utilized for the agent-simulator environment of FIG. 6B. The decision parameters include at least a distance parameter value of two and four distinct well placement locations (i.e., A, B, C, and D), and the constraints include at least a number of available drilling rigs of two. Accordingly, due to the number of available drilling rigs being two in FIG. 6B, each well placement sequence includes a pair of wells.

Notably, the action space 620B includes four well placement locations—A, B, C, and D. In some embodiments, well placement locations, such as A, B, C, and D, can be directly provided to the agent-simulator environment by a user (e.g., via user interface 240 of FIG. 2), and a set of well placement sequences can be generated based on the well placement locations directly provided by the user. Based on the well placement locations of A, B, C, and D, and the number of available drilling rigs being two, a set of well placement sequences can be generated, and include the well placement sequences: (A,B), (A,C), (A,D), (B,C), (B,D), and (C,D).

Alternatively, if the well placement locations are not provided, then the two dimensional 10×10 action space 620B provides 100 available well placement locations, and if the number of available drilling rigs remains two, then there are 4,950 well placement sequences. However, many of those can be eliminated through pre-processing based on a given distance parameter value.

Referring back to FIG. 6B, various well placement sequences in the generated set of well placement sequences can be removed from the set of well placement sequences by pre-processing the set of the well placement sequences using the distance parameter value of two (e.g., with respect to FIG. 3). For example, the number of well placement sequences in the set, for the action space 620B, can be reduced by removing each of the well placement sequences in the set with a pairwise distance less than the distance parameter value of two. Accordingly, well placement sequences (A,B) and (C,D) are removed from the set of well placement because the pairwise distance for (A,B) and (C,D) is less than two. By using the distance parameter value in pre-processing, the set of well placement sequences is reduced from six to four, and include the well placement sequences: (A,C), (A,D), (B,C), and (B,D).

Moreover, one or more actions can be associated with each of the well placement sequences in the set of well placement sequences. The one or more actions are indicated by arrows around well placement locations A and D in FIG. 6B. For example, the one or more actions may include at least: moving a given oil well for a given well placement sequence in an up direction, moving the given oil well for the given well placement sequence in a down direction, moving the given oil well for the given well placement sequence in a left direction, moving the given oil well for the given well placement sequence in a right direction, maintaining a location of the given oil well for the given well placement sequence, and drilling at the location of the given oil well for the given well placement sequence. In some embodiments, each of the one or more actions is associated with each of the well placement sequences in the set of well placement sequences. In some other embodiments, a subset of the one or more actions is associated with each of the well placement sequences in the set of well placement sequences.

As described in more detail herein (e.g., with respect to FIG. 4), at each time step of a simulation, one of the actions is simulated for a given well placement sequence. In some embodiments, a given action can be simulated for each oil well in the well placement sequence at the time step (i.e., for well placement sequence (A,C), move A to the left and move C to the left). In some other embodiments, a given action can be simulated for a subset of oil wells in the well placement sequence at the time step (i.e., for well placement sequence (A,C), move A to the left, but do not move C). In yet other embodiments, different actions can be simulated for each oil well in the well placement sequence at the time step (i.e., for well placement sequence (A,C), move A to the left and move C to the right).

Also as described in more detail herein (e.g., with respect to FIG. 4), an agent may iteratively provide each well placement sequence ((A,C), (A,D), (B,C), and (B,D)) to the simulator to determine an initial reward distribution for each of the well placement sequences in the set by simulating each action (i.e., one or more of the actions indicated above). Further, after each of the initial reward distributions are determine, the agent may select a given well placement sequence ((A,C), (A,D), (B,C), or (B,D)) upon which to execute subsequent simulations using a modified UCB algorithm (e.g., described with respect to FIGS. 1A, 1B, and 3). After each simulation, the reward distribution is updated such that the agent can subsequently select another well placement sequence based on the updated reward distributions. For example, after each of the initial reward distributions for well placement sequences (A,C), (A,D), (B,C), and (B,D) are determined, suppose well placement sequence (A, D) has the highest initial reward distribution. The agent may provide well placement sequence (A,D) to the simulator, and each of the one or more actions may be simulated for well placement sequence (A D).

In some embodiments, only the initial reward distribution for well placement sequence (A,D) may be updated based on a determined reward from the simulation. In some other embodiments, one or more initial reward distributions corresponding to (A,C), (B,C), and (B,D) may be updated in addition to the initial reward distribution corresponding to well placement sequence (A,D). In some of those other embodiments, the initial reward distribution corresponding to well placement sequence (A,D) may receive a full update, the initial reward distribution corresponding to well placement sequences (A,C) and (B,D) may receive a weighted updated of ½ as compared to the full update, and, the initial reward distribution corresponding to well placement sequence (B,C) may receive a weighted updated of ¼ as compared to the full update.

This process of selecting a well placement sequence in the set using the modified UCB algorithm, simulating one or more of the actions for the selected well placement sequence, and updating the reward distributions can be repeated until convergence.

Moreover, the action space (e.g., 620A, 620B of FIGS. 6A-6B), well locations (e.g., A, B, C, and D of FIGS. 6A-6B), and each of the simulated actions for a given well placement sequence can be displayed for each simulation (e.g., via user interface 240 of computer 202 of FIG. 2). In some embodiments, upon convergence, a well placement plan can be displayed and well locations for an optimal placement sequence can be visually demarcated (e.g., highlighted, bolded, or otherwise visually distinguished on a user interface) in the action space. In some additional and/or alternative embodiments, a notification can be provided (e.g., via user interface 240 of computer 202 of FIG. 2) that can include an indication of an optimal well placement sequence, an indication of data related to the simulation (e.g., the reward distribution for each well placement sequence in the set, the total number of well placement sequences selected by the agent, total number of times each of well placement sequences were selected by the agent, etc.). Further, upon convergence, additional simulations can be performed using the optimal well placement sequence to further develop a well placement plan (e.g., drilling simulations, flow simulations, etc.).

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It will be appreciated that various additional modifications may be made to the embodiments discussed herein, and that a number of the concepts disclosed herein may be used in combination with one another or may be used separately. Therefore, the invention lies in the claims hereinafter appended.

What is claimed is:

1. A method implemented by one or more processors, the method comprising:
   receiving a set of well placement sequences for placing wells in a geographical region, each well placement sequence in the set defining a sequence of multiple wells to be placed within the geographical region;
   executing a computer-implemented simulation on each of the well placement sequences in the set to determine, for each of the well placement sequences, a reward based upon a calculated hydrocarbon recovery for the well placement sequence and a cost of the calculated hydrocarbon recovery, wherein the cost of the calculated hydrocarbon recovery comprises a cost to drill at a particular location of the geographic region;
   iteratively selecting, by an agent, well placement sequences in the set upon which to execute, by a simulator, computer-implemented simulations from among the plurality of well placement sequences to generate a respective updated reward for each of the iteratively selected well placement sequences, wherein the selecting is based upon the rewards determined for each of the plurality of well placement sequences, wherein the simulator and the agent comprise an agent-simulator environment that models a reinforcement learning environment;
   obtaining an action space corresponding to the geographical region, the action space being an n dimensional representation of the geographical region, and the action space including one or more areas of interest indicative of predicted hydrocarbon saturation, wherein n is a positive integer;
   obtaining a plurality of actions, wherein a given action of the actions is to be performed, at a given time step of the computer-implemented simulation, in the action space for each of the well placement sequences in the set;
   configuring the simulator to execute the computer-implemented simulation on each of the well placement sequences in the set based on the action space and the set of well placement sequences; and
   for each of the well placement sequences in the set:
      performing, by the configured simulator, each action in the action space to determine:
         the reward for each of the actions, at the given time step, based upon the calculated hydrocarbon recovery for the iteratively selected well placement sequence, and
         the cost of the calculated hydrocarbon recovery for each of the actions, at the given time step, for the well placement sequence; and
      generating, based on the reward and the cost for each of the actions, a reward distribution.

2. The method of claim 1, further comprising:
   until convergence of an upper confidence bound algorithm:
      selecting, based on the reward distribution for each of the well placement sequences in the set, a given well placement sequence;
      performing, by the configured simulator and for the given well placement sequence, each action in the action space to determine:
         a new reward for each of the actions based upon the calculated hydrocarbon recovery for the given well placement sequence, and
         a new cost of the calculated hydrocarbon recovery for each of the actions for the given well placement sequence; and
      updating, based on the new reward and the new cost for the given well placement sequence, the reward distribution for the given well placement sequence to generate an updated reward distribution for the given well placement sequence.

3. The method of claim 2, wherein convergence is based on one or both of:
   a threshold number of computer-implemented simulations being executed, and
   a confidence threshold for a particular reward distribution corresponding to a particular well placement sequence being exceeded.

4. The method of claim 2, wherein updating the reward distribution for the given well placement sequence further comprises:
   updating, based on the new reward and the new cost for the given well placement sequence, the reward distribution for each of the well placement sequences within a threshold distance of the given well placement sequence.

5. The method of claim 1, wherein each of the plurality of actions are associated with each of the well placement sequences, the method further comprising:
- storing the association of each of the actions with each of the well placement sequences in one or more databases; and
- prior to executing the computer-implemented simulation for a given well placement sequence, retrieving, from one or more of the databases, the association of each of the actions with each of the well placement sequences.

6. The method of claim 1, further comprising:
- prior to executing the computer-implemented simulation on each of the well placement sequences in the set:
  - determining a number of well placement sequences in the set of well placement sequences; and
  - in response to determining the number of well placement sequences in the set of well placement sequences exceeds a threshold number of well placement sequences, processing the well placement sequences to reduce the number of well placement sequences in the set.

7. The method of claim 6, wherein processing the well placement sequences to reduce the number of well placement sequences in the set comprises:
- receiving, from a user, one or more decision parameters, the one or more decision parameters including at least a distance parameter;
- calculating a pairwise distance for each well placement sequence in the set;
- calculating a distance for each of the well placement sequences to reach one or more of the areas of interest indicative of predicted hydrocarbon saturation; and
- reducing, based on the calculating, the number of well placement sequences in the set by removing a particular well placement sequences when:
  - the pairwise distance is less than the distance parameter, or
  - the distance to reach one or more of the areas of interest indicative of predicted hydrocarbon saturation is greater than the distance parameter.

8. The method of claim 1, wherein receiving the set of well placement sequences comprises:
- receiving a plurality of well placement locations from a user; and
- generating the set of well placement sequences based on the received well placement locations.

9. A method implemented by one or more processors, the method comprising:
- generating a set of well placement sequences for placing wells in a geographical region, each well placement sequence in the set defining a sequence of multiple wells to be placed within the geographical region;
- obtaining one or more actions, wherein one or more of the actions are associated with each of the generated well placement sequences in the set;
- iteratively providing each of the well placement sequences in the set to execute a computer-implemented simulation on each of the well placement sequences in the set using the associated one or actions to determine, for each of the well placement sequences, an initial reward distribution based upon a calculated hydrocarbon recovery for each of the well placement sequences and a cost of the calculated hydrocarbon recovery for each of the well placement sequences, wherein the cost of the calculated hydrocarbon recovery comprises a cost to drill at a particular location of the geographic region;
- storing, for each of the well placement sequences in the set, the initial reward distribution in one or more databases;
- iteratively selecting, by an agent and based on the initial reward distributions, a given well placement sequence in the set to perform, by a simulator, a further computer-implemented simulation with the given well placement sequence to generate a respective updated reward for the given well placement sequence, wherein the simulator and the agent comprise an agent-simulator environment that models a reinforcement learning environment;
- updating, in one or more of the databases, the initial reward distribution corresponding to the given well placement sequence to obtain an updated reward distribution for the given well placement sequence;
- obtaining an action space corresponding to the geographical region, the action space being an n dimensional representation of the geographical region, and the action space including one or more areas of interest indicative of predicted hydrocarbon saturation, wherein n is a positive integer;
- providing, to the simulator, the action space and the provided well placement sequence, wherein the simulator is configured, to execute the computer-implemented simulation, based on the action space and the provided well placement sequence;
- receiving, for each of the well placement sequences in the set, and from the configured simulator for a given time step:
  - the reward for each of the actions, at the given time step, based upon the calculated hydrocarbon recovery for the well placement sequence, and
  - the cost of the calculated hydrocarbon recovery for each of the actions, at the given time step, for the well placement sequence; and
- determining, based on the reward and the cost for each of the actions, a reward distribution.

10. The method of claim 9, further comprising:
- until convergence of an upper confidence bound algorithm:
  - selecting, based on the reward distribution for each of the well placement sequences in the set, a given well placement sequence;
  - receiving, from the configured simulator and for the given well placement sequence at the given time step:
    - a new reward for each of the actions, at the given time step, based upon the calculated hydrocarbon recovery for the given well placement sequence, and
    - a new cost of the calculated hydrocarbon recovery for each of the actions, at the given time step, for the given well placement sequence; and
  - updating, based on the new reward and the new cost for the given well placement sequence, the reward distribution for the given well placement sequence to generate an updated reward distribution for the given well placement sequence.

11. The method of claim 10, wherein convergence is based on one or both of:
- a threshold number of computer-implemented simulations being executed, and
- a confidence threshold for a particular reward distribution corresponding to a particular well placement sequence being exceeded.

12. The method of claim 10, wherein updating the reward distribution for the given well placement sequence further comprises:
updating, based on the new reward and the new cost for the given well placement sequence, the reward distribution for each of the well placement sequences within a threshold distance of the given well placement sequence.

13. The method of claim 9, further comprising:
prior to iteratively providing each of the well placement sequences in the set to the simulator:
determining a number of well placement sequences in the set of well placement sequences; and
in response to determining the number of well placement sequences in the set of well placement sequences exceeds a threshold number of well placement sequences, processing the well placement sequences to reduce the number of well placement sequences in the set.

14. The method of claim 13, wherein processing the well placement sequences to reduce the number of well placement sequences in the set comprises:
receiving, from a user, one or more decision parameters, the one or more decision parameters including at least a distance parameter;
calculating a pairwise distance for each well placement sequence in the set;
calculating a distance for each of the well placement sequences to reach one or more of the areas of interest indicative of predicted hydrocarbon saturation; and
reducing the number of well placement sequences in the set by removing a particular well placement sequences when:
the pairwise distance is less than the distance parameter between wells, or the distance to reach one or more of the areas of interest indicative of predicted hydrocarbon saturation is greater than the distance parameter.

15. The method of claim 9, wherein generating the set of well placement sequences comprises:
receiving a plurality of well placement locations from a user; and
generating the set of well placement sequences based on the received well placement locations.

16. A system comprising:
at least one processor; and
at least one storage device that stores instructions that, when executed, cause the at least one processor to:
receive a set of well placement sequences for placing wells in a geographical region, each well placement sequence in the set defining a sequence of multiple wells to be placed within the geographical region;
execute a computer-implemented simulation on each of the well placement sequences in the set to determine, for each of the well placement sequences, a reward based upon a calculated hydrocarbon recovery for the well placement sequence and a cost of the calculated hydrocarbon recovery, wherein the cost of the calculated hydrocarbon recovery comprises a cost to drill at a particular location of the geographic region;
iteratively select, by an agent, well placement sequences upon which to execute, by a simulator, computer-implemented simulations from among the plurality of well placement sequences to generate a respective updated reward for each of the iteratively selected well placement sequences, wherein the agent inductively selects the well placement sequences based upon the rewards determined for each of the plurality of well placement sequences, wherein the simulator and the agent comprise an agent-simulator environment that models a reinforcement learning environment;
obtain an action space corresponding to the geographical region, the action space being an n dimensional representation of the geographical region, and the action space including one or more areas of interest indicative of predicted hydrocarbon saturation, wherein n is a positive integer;
obtain a plurality of actions, wherein a given action of the actions is to be performed, at a given time step of the computer-implemented simulation, in the action space for each of the well placement sequences in the set;
configure the simulator to execute the computer-implemented simulation on each of the well placement sequences in the set based on the action space and the set of well placement sequences; and
for each of the well placement sequences in the set:
performing, by the configured simulator, each action in the action space to determine:
the reward for each of the actions, at the given time step, based upon the calculated hydrocarbon recovery for the well placement sequence, and
the cost of the calculated hydrocarbon recovery for each of the actions, at the given time step, for the well placement sequence; and
generating, based on the reward and the cost for each of the actions, a reward distribution.

* * * * *